(12) United States Patent
Chheang et al.

(10) Patent No.: US 6,884,833 B2
(45) Date of Patent: Apr. 26, 2005

(54) DEVICES, COMPOSITIONS, AND METHODS INCORPORATING ADHESIVES WHOSE PERFORMANCE IS ENHANCED BY ORGANOPHILIC CLAY CONSTITUENTS

(75) Inventors: Theary Chheang, Bloomington, MN (US); Andrew M. Hine, St. Paul, MN (US); Mark W. Muggli, West St. Paul, MN (US); Susan C. Noe, St. Paul, MN (US); Patricia M. Sanft, St. Paul Park, MN (US); William J. Schultz, Vadnais Heights, MN (US); Robert D. Taylor, Stacy, MN (US); Stanley F. Tead, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 114 days.

(21) Appl. No.: 09/896,655

(22) Filed: Jun. 29, 2001

(65) Prior Publication Data
US 2003/0100654 A1 May 29, 2003

(51) Int. Cl.[7] ................................. C08K 3/34
(52) U.S. Cl. ...................... 524/445; 524/186
(58) Field of Search ................ 524/445, 446, 524/447, 450; 450/530, 527

(56) References Cited

U.S. PATENT DOCUMENTS

| | | | |
|---|---|---|---|
| 3,084,117 A | 4/1963 | Nahin et al. ................. 204/158 |
| 3,252,757 A | 5/1966 | Granquist ..................... 23/111 |
| 3,586,478 A | 6/1971 | Neumann ...................... 23/111 |
| 3,666,407 A | 5/1972 | Orlemann ..................... 23/111 |
| 3,671,190 A | 6/1972 | Neumann ...................... 23/111 |
| 3,844,978 A | 10/1974 | Hickson ................. 252/455 R |
| 3,844,979 A | 10/1974 | Hickson ................. 252/455 R |
| 3,852,405 A | 12/1974 | Granquist ................... 423/118 |
| 3,855,147 A | 12/1974 | Granquist ................... 252/317 |
| 4,606,962 A | 8/1986 | Reylek et al. ............... 428/148 |
| 4,695,402 A | 9/1987 | Finlayson et al. ........ 252/315.2 |
| 4,698,242 A | 10/1987 | Salerno |
| 4,740,657 A | 4/1988 | Tsukagoshi et al. ....... 174/88 R |
| 4,889,885 A | 12/1989 | Usuki et al. ................. 524/445 |
| 5,244,707 A | 9/1993 | Shores ........................ 428/76 |
| 5,288,799 A | 2/1994 | Schmid et al. |
| 5,336,647 A | 8/1994 | Nae et al. .................... 501/146 |
| 5,429,999 A | 7/1995 | Nae et al. .................... 501/146 |
| 5,522,962 A | 6/1996 | Koskenmaki et al. .... 156/272.4 |
| 5,604,026 A | 2/1997 | King ........................ 428/317.1 |
| 5,672,400 A * | 9/1997 | Hansen et al. ............. 428/40.1 |
| 5,686,703 A | 11/1997 | Yamaguchi ................. 174/259 |
| 5,730,791 A | 3/1998 | Krogh et al. .......... 106/284.06 |
| 5,747,560 A | 5/1998 | Christiani et al. |

(Continued)

FOREIGN PATENT DOCUMENTS

| | | | | |
|---|---|---|---|---|
| EP | 0 747 322 B1 | 9/2001 | ......... C01B/33/44 |
| JP | 62-177082 A | 8/1987 | ............. C09J/3/00 |
| JP | 2-206670 A | 8/1990 | ............. C09J/9/02 |
| JP | 3-223380 A | 10/1991 | ............. C09J/9/02 |
| WO | WO 93/04117 | 3/1993 | ............. C08K/3/34 |
| WO | WO 93/11190 | 6/1993 | ............. C08K/7/00 |
| WO | WO 97/30950 | 8/1997 | ......... C04B/14/00 |
| WO | WO 99/07790 | 2/1999 | ......... C08L/51/00 |
| WO | WO 99/41299 | 8/1999 | ............. C08J/5/10 |
| WO | WO 00/34378 | 6/2000 | ............ C08K/9/04 |

OTHER PUBLICATIONS

Odian, "Physical State", *Principles of Polymerization*, 2nd Ed., 1981, pp. 25 and 33.

Primary Examiner—Katarzyna Wyrozebski
(74) Attorney, Agent, or Firm—Dean M. Harts

(57) ABSTRACT

Incorporating organophilic clay into hot melt adhesive compositions, particularly those comprising semi-crystalline, thermoplastic polymers, greatly improves the adhesive properties in many respects. Some of these improvements are particularly beneficial to the specific use of hot melt adhesives filled with electrically conductive particles for use as electrically conductive adhesives.

20 Claims, 2 Drawing Sheets

U.S. PATENT DOCUMENTS

| | | | |
|---|---|---|---|
| 5,760,106 A | 6/1998 | Pinnavaia et al. | 523/209 |
| 5,780,376 A | 7/1998 | Gonzales et al. | 501/146 |
| 5,801,216 A * | 9/1998 | Pinnavaia et al. | 523/209 |
| 6,025,119 A * | 2/2000 | Majumdar et al. | 430/529 |
| 6,060,230 A * | 5/2000 | Christian et al. | 430/530 |
| 6,214,460 B1 | 4/2001 | Bluem et al. | 428/355 AC |
| 6,579,927 B1 * | 6/2003 | Fischer | 524/445 |
| 6,767,951 B1 * | 7/2004 | Nair et al. | 524/445 |

* cited by examiner

DEVICES, COMPOSITIONS, AND METHODS INCORPORATING ADHESIVES WHOSE PERFORMANCE IS ENHANCED BY ORGANOPHILIC CLAY CONSTITUENTS

FIELD OF THE INVENTION

The present invention relates to hot melt adhesive compositions, particularly those including a semi-crystalline thermoplastic polymer and an organophilic clay. These compositions have a wide variety of uses and are especially suitable for incorporation into electrically conductive adhesive compositions useful in the fabrication of electronic devices, e.g., to connect electronic components such as a flex circuit and a printed circuit board (PCB). The formulations of such electrically conductive adhesive compositions further incorporate electrically conductive particles in addition to the polymer and clay components.

BACKGROUND OF THE INVENTION

Many conventional hot melt adhesives are thermoplastic materials. Hot melt adhesives typically exist as solids at room temperature and can be converted into a flowable liquid upon application of heat and/or pressure. To form a bond between adherends, the adhesive is first converted into a softened or molten state. The adhesive is then allowed to solidify upon cooling to form the bond. In comparison to thermosetting adhesives, i.e., adhesives that undergo chemical crosslinking upon curing, hot melt adhesives possess many advantages. One major advantage is that hot melt adhesives may be formulated without any liquid carrier. Also, bonding occurs immediately upon cooling, although improved bond properties for semi-crystalline hot melt adhesives may develop over minutes or days as crystallization progresses. Bonds formed from thermoplastic materials are also repairable in that they can usually be removed and replaced without damage to the substrate(s) being bonded.

The adhesive matrix properties of a hot melt adhesive are key factors in determining the performance and reliability of a hot melt adhesive bond between substrates that are to be bonded together. The adhesive should flow sufficiently at a suitable bonding temperature to allow the substrate surfaces to be adequately wetted by the adhesive. In addition, the adhesive composition should bond rapidly upon cooling. When the bonding operation is complete, the adhesive should have sufficient toughness to provide good resistance to peel, and should have high enough modulus and creep resistance sufficient to withstand the expected stress and/or high or low temperatures, at least through the range of use. In some cases, it is further desirable that the adhesive be reworkable at a processing temperature that is sufficiently low so that the substrate is not damaged during removal and replacement. The adhesive should have an extended shelf life at room temperature (i.e., is storage-stable). The adhesive may need sufficiently low moisture absorption to maintain adequate performance (electrical resistance, peel strength, etc.) at conditions of elevated temperature and humidity.

Hot melt adhesive compositions are used in a wide range of home and industrial applications. Examples of such applications include package sealing, wood bonding, plastic assembly such as home crafts, fabric bonding, and bonding flexible circuits to substrates.

One illustrative application of hot melt adhesives involves their formulation and use as electrically conductive adhesives, especially anisotropically electrically conductive adhesives. Anisotropically electrically conductive adhesive compositions often include electrically conductive particles dispersed in a polymeric adhesive. These adhesive compositions have the ability to establish multiple, discrete, electrical connections, often in extremely close proximity, between two substrates. The compositions can be used to mechanically bond and electrically interconnect an electrical component on the first substrate to an electrical component on the second substrate. The electrical contact is primarily a pressure-engaged contact and is maintained by the adhesive matrix holding the two substrates together. A typical use is to electrically couple the contacts in a flex circuit to the corresponding multiple contacts of a printed circuit board.

Commonly, these adhesives may be delivered as a layer on a release liner or as free standing films in which the polymeric adhesive matrix contains a sufficient amount of the conductive particles to allow electrical conduction through the thickness (the z-axis) of the film after bonding. Because of the insulating nature of the adhesive polymer matrix, and the low volume fraction of conductive particles, the films allow essentially no conductivity in the plane of the film (x and y-axis directions). Such film types also are known as "z-axis adhesive films" or "ZAF's."

Anisotropically electrically conductive adhesive films additionally containing non-electrically conductive fillers, are known in the literature. For example, Japanese Patent Kokai Publication No. 3-223380 discloses an anisotropic conductive film that includes 20% by volume aluminum oxide or aluminum nitride with a particle size of 10 to 20 micrometer in addition to containing electrically conductive particles.

Japanese Patent Kokai Publication No. 2-206670 discloses an anisotropic conductive film containing 3 to 50% by volume of a thermally conductive filler having an average particle size of 1 micrometer to 50 micrometer in addition to containing electrically conductive particles.

Japanese Patent Kokai Publication No. 62-177082 discloses an anisotropic conductive film containing 1 to 30% by weight silica particles having an average primary particle size of 4 micrometer to 100 micrometer. The conductive particles are metal-clad organic polymer cores.

U.S. Pat. No. 5,672,400 describes the use of a semi-crystalline thermoplastic as the adhesive matrix for a ZAF. Key features of this adhesive are a relatively high modulus over the use temperature range (associated with low tendency to creep) and a relatively low modulus (or viscosity) at the bonding temperature (associated with fast bonding since the bond time is limited by the time for the adhesive to flow out of the way and allow the conductive substrates to make connections to the electrically conductive particles). Fillers are listed that can be used to provide increased adhesion, higher modulus, and decreased coefficient of thermal expansion. These fillers include silica particles, silicate particles, quartz particles, ceramic particles, glass bubbles, inert fibers, and mica particles. Organophilic clays are not suggested.

It is highly desirable for the adhesive of an anisotropically electrically conductive adhesive composition to provide fast bonding times as well as rapid development of creep resistance and peel strength. In the past, both thermosetting and thermoplastic adhesive polymers have been used in electrically conductive adhesive compositions. Thermosets, or more specifically thermoset adhesives, tend to flow readily during the initial phases of bonding (i.e. prior to curing) due to their relatively low molecular weight, and have high creep resistance and peel strength once cured, due to the chemical crosslinks in the system, but suffer from relatively long bonding times before such characteristics develop adequately. As another drawback, thermoset adhesives may not be repairable, i.e., they cannot be removed from a substrate without leaving a residue or degrading the substrate surface.

In contrast to thermosetting materials, thermoplastics, more specifically thermoplastic adhesives, can bond more rapidly than thermoset adhesives since no time is needed to allow the adhesive to cure. However, most thermoplastics do not have sufficient creep resistance and peel strength to perform adequately in some applications in which anisotropically electrically conductive adhesive compositions are used. In addition, many thermoplastics do not exhibit sufficient flow at elevated temperatures to enable very rapid bonding.

Semi-crystalline thermoplastics are a desirable subset of thermoplastics for use in hot-melt adhesives, including ZAF's. The crystalline regions of the semi-crystalline thermoplastic serve as physical crosslinks, which allow the material to perform more like a thermoset below the melting point of the crystalline regions. Above the melting point of the crystalline regions, the material flows readily, enabling rapid bonding.

However, one problem affecting conventional anisotropically electrically conductive adhesive compositions concerns resistance against the formation of cavitation voids during bonding. When a ZAF or other anisotropically electrically conductive adhesive composition is used to bond two electronic substrates together, it is common for pressure to be applied along with heat during bonding. In one typical bonding method, a heated block (hot bar) or thermode is used to apply both heat and pressure. As used herein, the term "thermode" is also intended to include hot bars, heated blocks, etc. This bonding pressure can deform one or both of the substrates. For example, when a flex circuit is bonded to a printed circuit board (PCB), the flexible circuit substrate (e.g. polyester, polyimide, etc.) may deform, particularly in the region between circuit lines. When the pressure is released, the deformed substrate can resiliently spring back toward its original configuration. Cavitation voids within the body of the adhesive polymer matrix can form as a result, because the internal strength of the adhesive typically is not high enough to resist the elastic recovery of the deformed substrate(s) when the thermode is lifted hot. Cavitation voids are desirably avoided, as these can make it more difficult to evaluate bond quality and are often perceived as being a potential source of failure and/or loss in performance.

Cavitation voids are not so easily avoided with conventional adhesive compositions. With respect to thermosets, crosslinking the adhesive in order to avoid formation of cavitation voids cannot be done prior to making the bond, as excessive crosslinking will prevent the adhesive from flowing and making the desired electrical contact. Crosslinking the adhesive during the bonding process (by incorporation of reactive sites that can react during bonding) tends to result in bond times that are too long to be practical or cost effective in high speed commercial fabrication processes. On the other hand, thermoplastics generally do not have sufficient internal strength immediately after bonding to resist the formation of cavitation voids as the thermode is lifted. Cooling the bondline while still maintaining pressure can be used to reduce the formation of cavitation voids. However, this undesirably increases the length of time required to make a bond. Clearly, some strategy for alleviating cavitation voids is needed.

Thus, further improvements in the performance of adhesive polymers based on semi-crystalline thermoplastics are desired in order to make them perform more like thermosets without requiring substantially longer bond times. It would be highly desirable to have an adhesive polymer that has the benefits of both thermosetting and thermoplastic materials, namely a combination of fast bonding times and rapid development of sufficiently high creep resistance and peel strength to be suitable for use in a wider range of applications, e.g., use as anisotropically electrically conductive adhesive compositions.

SUMMARY OF THE INVENTION

It has now been discovered that incorporating organophilic clay into hot melt adhesive compositions, particularly those comprising semi-crystalline polymers, greatly improves the adhesive properties in many respects. Some of these improvements are particularly beneficial to the specific use of hot melt adhesives filled with electrically conductive material for use as electrically conductive adhesives or the like. Firstly, the use of such clays dramatically increases the rate of recrystallization (i.e. after bonding) of thermoplastic, semi-crystalline polymers, leading to substantially more rapid build up of peel strength and creep resistance. Systems incorporating such clays and thermoplastic, semi-crystalline polymers tend not only to recrystallize faster but also tend to develop dramatically higher levels of creep resistance and peel strength as compared to otherwise identical systems lacking such clay. In the specific case of use as an anisotropically electrically conductive adhesive, the improved creep resistance can result in improved electrical stability (e.g. in response to applied mechanical stresses).

Additionally, the use of organophilic clays dramatically reduces the formation of cavitation voids in anisotropically electrically conductive adhesives without adversely affecting the ability of the composition to flow and allow electrical interconnection during bonding. The optimum concentration of such clay may vary depending upon which properties of the composition are being optimized, e.g. a different clay concentration might be used to optimize primarily for peel strength than would be used to optimize for creep and cavitation void resistance.

In one aspect, the present invention relates to a hot melt adhesive composition. The composition includes a semi-crystalline, thermoplastic, hot melt adhesive polymer; and a clay component incorporated into the adhesive polymer. The clay component includes an organophilic clay.

In another aspect, the present invention relates to an electrically conductive adhesive composition comprising a polymeric adhesive component; an electrically conductive filler incorporated into the adhesive component; and a clay component incorporated into the adhesive component, said clay component comprising an organophilic clay.

In another aspect, the present invention relates to an anisotropically conductive adhesive composition. The composition includes a polymeric adhesive component; an electrically conductive filler incorporated into the adhesive component; and a clay component incorporated into the adhesive component, wherein the clay component comprises an organophilic clay.

In another aspect, the present invention relates to a method of providing an electrical connection between first and second electrical conductors. An electrical component on a first structure is electrically coupled to an electrical component on a second structure using an adhesive composition. The adhesive composition comprises a polymeric adhesive component; an electrically conductive filler incorporated into the adhesive component; and a clay component incorporated into the adhesive component. The clay component comprises an organophilic clay. In another aspect, the present invention relates to a method of making an electrically conductive adhesive composition. An organophilic clay is incorporated into an adhesive composition. After incorporating the clay into the adhesive, an electrically conductive filler is incorporated into the adhesive composition.

In another aspect, the present invention relates to an electronic assembly, comprising a first structure comprising a first electrical component; a second structure comprising a second electrical component; and an anisotropically electrically conductive adhesive composition electrically interconnecting said first and second electrical components. The composition includes a polymeric adhesive component; an electrically conductive filler incorporated into the adhesive component; and a clay component incorporated into the adhesive component. The clay component comprises an organophilic clay.

In another aspect, the present invention relates to a method of making an anisotropically conductive adhesive composition comprising an adhesive polymer, an organophilic clay incorporated into the adhesive composition, and a plurality of electrically conductive particles incorporated into the adhesive composition.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein.

DETAILED DESCRIPTION OF PRESENTLY PREFERRED EMBODIMENTS

Figure 1:
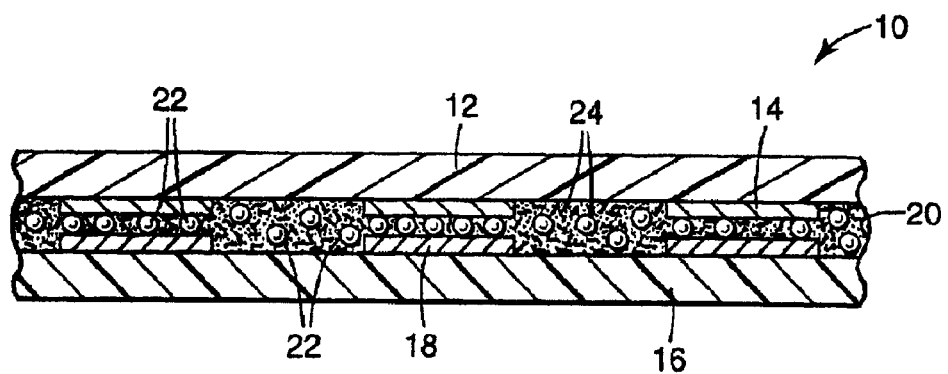
FIG. 1 is a cross-sectional view of an electronic assembly of the present invention.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

The hot melt adhesive compositions of the present invention generally include a polymer adhesive component and an organophilic clay distributed in the polymer adhesive component. The polymeric adhesive component of the present invention comprises at least one semi-crystalline thermoplastic polymer. Curable monomeric, oligomeric, and/or polymeric components also may optionally be included. Those embodiments constituting electrically conductive adhesives may further include electrically conductive particles.

Representative examples of suitable polymers for use in the polymer adhesive component include semi-crystalline acrylate polymers, ethylene-acrylate copolymers, ethylene-acrylic acid copolymers, ethylene-vinyl acetate copolymers, polyethylene, ethylene-propylene copolymers, carboxylated styrene-ethylene-butadiene-styrene block copolymers, epoxidized styrene-ethylene-butadiene-styrene block copolymers, styrene-isoprene block copolymers, polybutadiene, ethylene-styrene-butylene block copolymers, polyether-polyamide block copolymers, polyvinyl butyral, polyvinyl chloride, polyvinyl formal, polyesters, polyethers, polyurethanes, polyamides, polyimides, polyvinyl acetal, polyvinyl ethers, polysulfones, polycaprolactones, combinations of these, and the like.

Preferred semi-crystalline polymers are thermoplastic, although it may also be desirable to include reactive functionality on a semi-crystalline polymer. The semi-crystalline thermoplastic adhesive resins may be used independently, as part of a copolymer, in blends of two or more polymers, or in combination with reactive monomers, oligomers, and/or polymers, and/or with the addition of other property modifying materials or adjuvants such as tackifiers and plasticizers. Such other reactive monomers, oligomers, and/or polymers could include for example, one or more (meth)acrylate monomers, cyanate ester polymers, epoxy resins, silicone resins, phenol resins, photocurable resins, anaerobic resins, combinations of these, and the like.

The weight average molecular weight of the adhesive polymers suitable in the practice of the present invention may vary within a wide range. For each such adhesive polymer, the weight average molecular weight may be independently selected so that the adhesive composition has the desired characteristics suitable for satisfying the demands of the intended environment in which the adhesive will be used. As general guidelines, the weight average molecular weight may be at least 1000, preferably 1000 to about 1,000,000, and more preferably 5000 to 800,000.

In preferred embodiments, the polymer adhesive component of the present invention comprises at least one hydrophobic, thermoplastic, semi-crystalline adhesive polymer, and more preferably one or more that can function as hot melt adhesives. As used herein, "hydrophobic" means that the water absorption of a material preferably is no more than about 4% by weight as measured according to the immersion test specified in ASTM D570, and preferably is no more than about 1.0% by weight following extended aging under 20° C./65% RH conditions. The term "semi-crystalline" as used herein refers to polymeric materials that show crystalline behavior, e.g., a sharp crystalline melting temperature, Tc, which is desirable for rapid device/substrate bonding operations at temperatures which are just above the Tc. The amorphous phase of the semi-crystalline polymeric materials of the invention also show a glass transition temperature, Tg. See, e.g., Odian, Principles of Polymerization (Second Edition), John Wiley & Sons, New York, (1981), pages 25 and 30.

The Tc (crystalline melting temperature as used herein), is the temperature at which the liquid-to-solid phase transition occurs in semi-crystalline polymers, since in semi-crystalline polymers there is a hysteresis in the solid-liquid phase transition depending on the temperatures through which it is approached, i.e., heating (the solid-to-liquid transition (Tm)), or cooling (the liquid-to-solid transition (Tc)). "Glass Transition Temperature (Tg)" as used herein is defined as the temperature (actually a narrow range of temperatures) at which a second order phase transition occurs. Above Tg, the polymers are soft, flexible, rubbery materials, while below Tg they are conversely hard, rigid plastics that behave like glass. The Tg of a given polymer can be determined using a variety of methods, and differential scanning calorimetry (DSC) is preferred.

The semi-crystalline polymers preferably have a crystallization temperature (Tc) which is sufficiently high to provide good performance of the bonded and recrystallized material over the desired use temperature range of the bonded article. Yet, the Tc should be low enough that the bond can be made without causing thermally-induced damage to the substrates to be bonded. The desirable Tc thus will depend on factors including the kind of substrates chosen for a given application. It will be clear to one skilled in the art that the selection of the Tc should be done based on the desired bonding temperature and the desired temperature range in which the adhesive will be used. For example, if a polyester-based flex circuit is to be bonded to a printed circuit board, a typical bonding temperature is usually less than about 150° C., while the maximum use temperature of the bonded article is up to 85° C. In this case, the Tc desirably is at least about 85° C., preferably at least about 100° C., and more preferably at least about 120° C. As another example, if the flex circuit to be bonded is made of polyimide, which generally is more heat resistant than polyester, the bonding temperature may be up to about 200° C., while the maximum use temperature of the bonded article may be up to about 125° C. In this case the Tc desirably is at least about 125° C., preferably at least about 140° C., and more preferably at least about 155° C.

The semi-crystalline polymeric materials of the invention provide creep resistance up to the recrystallization temperature (Tc), which is higher than the glass transition temperature (Tg). Consequently, notwithstanding the relatively lower Tg, high dimensional stability of the bond is maintained at high temperature due to the semi-crystalline nature of the polymer. The melt of the crystalline regions of the semi-crystalline polymer at the Tc also provides a steep viscosity/temperature gradient above Tc. This leads to excellent flow of the adhesive during bonding operations.

The preferred hydrophobic, hot melt, thermoplastic, semi-crystalline adhesive polymer(s), due to their hydrophobic character, have a reduced tendency to absorb water, water vapor, or other moisture. Moisture uptake is generally undesirable as it can impair device performance and/or adversely affect the strength of the adhesive bond. Additionally, the hydrophobic materials tend to be more compatible with organophilic clay.

Particularly preferred embodiments of thermoplastic, hydrophobic, semi-crystalline polymers include those described in U.S. Pat. No. 5,672,400, the entirety of which is incorporated herein by reference. These polymers may be used singly or in combination with one or more other polymers. Generally, this patent describes thermoplastic, semi-crystalline adhesive polymers that are comprising polyether monomeric units (PE) and polyamide monomeric units (PA). Each of the PA and PE monomeric units can independently repeat in the copolymer of the present invention. Alternatively, the PA and PE segments may be arranged to form a block copolymer such as one of the AB, BAB, ABA types, or the like. The concentration of each in the copolymer may vary widely depending on the physical characteristics, mechanical properties, dynamic properties, thermal properties, electrical properties and environmental or chemical resistance desired in the adhesive composition.

Preferably, the relative amount of each of the PA and PE units is such that the copolymers have a Shore D hardness of about 20 to about 70 at room temperature as measured according to ASTM D2240. The copolymer preferably also have a melt temperature, Tm, of about 75° C. to about 220° C., preferably 100° C. to about 180° C. as measured by DSC according to ASTM D3418. "Melt temperature," Tm, as used herein, is the temperature at which the solid-to-liquid phase transition occurs in semi-crystalline polymers.

The polyamide units (PA) of the copolymer may vary widely, and any polyamide which includes a basic —C(O)NH— unit may be used. Examples include poly (caprolactam) (Nylon 6), poly(hexamethylene adipamide) (Nylon 6/6), poly(hexamethylene nonanediamide) (Nylon 6/9), poly(hexamethylene sebacemide) (Nylon 6/10), poly (hexamethylene dodecanediamide) (Nylon 6/12), poly (undecanoamide) (Nylon 11), poly(lauryllactam) (Nylon 12). Polyamide units with low moisture absorption are preferred for use in the present invention to prevent softening and increased electrical resistance of the adhesive composition under high humidity conditions, and Nylon 12 is particularly preferred.

The polyether segment (PE) may also vary widely, and any polyether which contains a basic —R—O—R— unit, wherein R can be a substituted or unsubstituted alkyl group, may be used. Poly (tetramethylene glycol) is particularly preferred for use in the copolymer used in the adhesive composition of the present invention.

A particularly preferred copolymer for use in the adhesive compositions of the present invention is shown below in Formula (I):

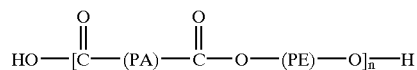

wherein PA represents a polyamide monomeric unit and PE represents a polyether monomeric unit. This preferred copolymer is available from Elf Atochem North America, Philadelphia, Pa., under the trade designation "PEBAX." A particularly preferred grade of PEBAX for use in the adhesive composition of the invention is "PEBAX 3533," in which the polyamide unit is Nylon 12 and the polyether unit is poly(tetramethylene glycol). This copolymer has a Tg of about −78° C. and a Shore D hardness of about 35 at room temperature as measured according to ASTM D2240. The copolymer also has a melt temperature, Tm, of about 110° C. to about 155° C. as measured by DSC according to ASTM D3418. The preferred polyamide/polyether copolymer used in the adhesive composition of the invention has elastomeric properties which are important to provide flexible bonds to substrates such as metals, glass and other polymeric materials. The copolymer is preferably present in the adhesive composition in an amount of about 60% to about 30% by weight, based on the total amount of the copolymer and a tackifier, if present, which is described below. The peel strength of the fully formulated adhesive composition of the invention, based on the copolymer, is in excess of is about 500 grams/cm at 20° C.

A wide variety of other thermoplastic, hydrophobic, semi-crystalline polymers also may be used in the present invention, either singly or in combination. Representative examples of suitable semi-crystalline polymers include ethylene/ethyl acrylate/glycidyl methacrylate terpolymers available from Elf Atochem North America, Philadelphia, Pa., and ethylene/butyl acrylate/glycidyl methacrylate terpolymers, available from Quantum Chemicals, Cincinnati, Ohio, under the trademark ENATHENE.™., and ethylene/ethyl acrylate/carbon monoxide terpolymers available from DuPont Company, Wilmington, Del. Other examples include semi-crystalline polymers of polyethylene, modified polyethylene, ethylene vinyl acetate, polyurethane, polyamide, polybutene, and polyester.

The adhesive of the invention comprising a semi-crystalline thermoplastic may further include a tackifier to increase the toughness of the bond and enhance peel adhesion to a wide range of substrate materials. Any tackifier that is compatible with the semi-crystalline thermoplastic polymer may be used. For the preferred embodiment in which the semi-crystalline polymer is a polyamide/polyether copolymer as described above, useful tackifying resins include rosin, rosin esters available from Hercules under the trade designations "STAYBELITE 5" and "FORAL 85," phenolic modified resins available from Hercules under the trade designation "PENTALYN 856," terpene phenolics available from Hercules under the trade designation "PICCOFYN T," from DRT under the trade designation "DERTOPHENE T," from Yasuhara Chemical under the trade designation "T 130," from Arizona Chemical under the trade designation "SYLVARES 2040," and from Arakawa chemical under the trade designation "TAMANOL 135," terpenics available from DRT under the trade designation "DERCOLYTE A115," terpenics of alkyl aromatic hydrocarbons available from Hercules under the trade designation "HERCULES AR 100," terpenes of an aromatic hydrocarbon available from Hercules under the trade designation "HERCULES A 120," terpenes of hydrogenated DCPD available from Exxon under the trade designation "ESCOREZ 5320," styrene based materials available from Hercules under the trade designation "KRISTALEX F 85," and coumarone indenes available from VFT under the trade designation "B 1/2135." of the above, terpene phenolics are preferred, and SYLVARES 2040 and TAMANOL 135 are particularly preferred. The tackifier may be present in a wide range of concentrations, and should be blended with the copolymer in sufficient amounts to provide the adhesive composition with a Tg of about −10° C. to about 40° C., preferably about 0° C. to about 20° C. Tackifying resins are useful in the present invention in an amount ranging from 40 to 70%, preferably about 50%, by weight based on the total weight of copolymer and tackifier present in the adhesive composition. The ratio by weight of copolymer to tackifier may be should be about 2:1 to about 0.5:1, and is most preferably about 1:1.

A wide variety of electrically conductive filler materials may be used in the electrically conductive adhesive compositions of the invention. Representative examples include metal particles; composite particles containing a metal coating formed on a core of suitable material(s) such as another metal, polymer(s), ceramic(s), glass, electrically conductive nanoparticles or nanotubes, or the like; conductive polymers; carbon black-containing particles; combinations of these; and the like. Specific examples of suitable metal particles are particles including one or more conductive metals such as nickel, aluminum, silver, copper, tin, lead, gold, zinc, platinum, cobalt, and their alloys (e.g. solders) optionally provided as a conductive coating on a suitable core. Electrically conductive particles are also described in U.S. Pat. Nos. 4,606,962 and 4,740,657.

Examples of suitable commercially available electrically conductive particles include solder particles such as lead/tin alloys in varying amounts of each metal (available from Sherritt Gordon Limited, Canada); solder powders available from Indium Corporation, Utica, N.Y. under the trade designation Indalloy; nickel spheres available from Novamet, Inc., Wykoff, N.J.; silver coated glass particles available under the trade designation Conduct-o-Fil from Potters Industries Inc., Carlstadt, N.J.; and metal powders available from Technic Inc., Woonsocket, R.I. Electrically conductive particles made with metal coatings on polymeric cores are also available from JCI Inc., White Plains, N.Y., and from Sekisui America Corporation, New York, N.Y.

Other electrically conductive fillers also may be used to provide electrical conductivity. Examples of these articles include woven or non-woven scrims or fabrics comprising metal or metal-coated fibers, or carbon fibers, or porous polymer films that have been metallized, such as those disclosed in U.S. Pat. No. 5,604,026. These articles may be incorporated into the electrically conductive adhesive of the invention via lamination or by infusing the electrically conductive article with the adhesive composition. As used herein, the term "incorporated into", in reference to the relative placement of the conductive fillers and/or articles with respect to an adhesive composition, means that the particles can be placed in adhesive contact with, coated with, placed within, placed partially within, and/or positioned on a surface of the composition. Examples of scrims include carbon fiber scrims or metal-coated scrims available under the trade designation "Optimat" from TFP Inc., Newburgh, N.Y.

The amount of electrically conductive materials used in the adhesive compositions of the invention may vary within a wide range. The preferred amounts will depend upon the intended end use. For example, for interconnecting a flexible circuit to a circuit board or to a liquid crystal display (LCD) where anisotropic or z-axis electrical conductivity is required, the compositions may contain from 1 to 20, and preferably, from 1 to 10 percent by volume of electrically conductive materials based upon the total volume of the composition. Alternatively, in bonding for shielding or grounding applications, such as for grounding a printed circuit board to a heat sink, or for electromagnetic interference (EMI) shielding, the compositions may contain from 1 to 80, and preferably, from 1 to 70 percent by volume electrically conductive material based upon the total volume of the composition. In this case, the electrically conductive material may comprise a conductive material besides or in addition to conductive particles, e.g. scrim, flake, fibers, etc.

Electrically conductive particles of the present invention may be characterized by a variety of geometries and may be, for example, spherical, oblong, acicular, platelet-shaped, flake shaped, dendritic, irregular, rectilinear, combinations of these and the like. For applications as a component of a ZAF, preferred particles are substantially spherical.

The particles may be present as individual particles or may be agglomerated, aggregated, or the like if such aggregations or agglomerations are not too big so as to impair adhesive or electronic performance. In general, when the particles are dispersed randomly into an anisotropic electrically conductive adhesive composition, or placed in a random pattern on one side of an adhesive film, the ratio of the distance between electrical conductors that should remain electrically unconnected to the particle size should be at least 1:1, more preferably at least 3:1, and typically at least 8:1. In practice, there is no limit on the upper end of the distance between electrical conductors that are to remain electrically unconnected, as compared to the particle size.

The minimum distance between adjacent conductors, however, is particularly relevant for the case in which only conductivity in the z-axis is desired. If the electrically conductive particles are placed onto or into the adhesive in a non-random pattern, the ratio can be lower than that for the case of random particle loading, but still preferably higher than 1:1. For the case of making a z-axis electrical interconnect using a ZAF with random or non-random particle placement, in typical electronic devices, the resultant particle size is in the range of from about 2 micrometers to about 60 micrometers.

While it will be clear to one skilled in the art that the use of smaller particles in an anisotropically electrically conductive adhesive composition will allow conductors to be placed more closely together without risk of undesired electrical interconnections being formed, the use of smaller particles also increases the time required to make an electrical bond since more adhesive must flow out of the way before electrical contact can be made. Smaller particles also result in a thinner ultimate bond line, which can result in lower peel strength. For this reason, the largest possible particles allowed by the conductor spacing design are preferred. For particle aggregates or agglomerations, the size of the aggregate or agglomeration, as the case may be, is deemed to be the particle size. For flakes or platelet shaped particles that tend to be oriented with their major surfaces substantially normal to the z-axis, the thickness of such flakes or platelets is deemed to be the particle size.

In the practice of the present invention, particle size is determined by any one or more of a plurality of methods that shall be obvious to one skilled in the art, including analysis of micrographs of particles or of particles embedded in adhesive, sieving particles through screens of a given mesh size, sedimentation techniques, and light scattering-based techniques such as using a Dynamic Light Scattering Particle Size Analyzer, instrument available from Horiba Inc., Sunnyvale, Calif.

The use of the organophilic clay provides numerous benefits. Firstly, the preferred semi-crystalline polymer(s) interact synergistically with the organophilic clay component in that the preferred compositions demonstrate exceptionally fast bonding and rapid development of high creep resistance and peel strength. The improvements in the rate of recrystallization, creep resistance and peel strength far exceed expectations. Indeed, in preferred embodiments of anisotropically electrically conductive adhesives, a bond can be made in 1 to 5 seconds with rapidly developed bond strength and creep resistance being at least sufficient to replace some thermosetting adhesive systems in some applications wherein the thermosetting adhesive systems require in excess of 20 seconds to bond and cure. In the absence of the organoclay component, the anisotropically electrically conductive adhesive can be bonded in the same short amount of time, but the bond strength takes longer to build (hours or days vs. seconds to minutes), and the creep resistance is substantially lower.

Indeed, the resultant adhesive compositions of the present invention can develop creep resistance as high as some conventional thermosetting polymers. In addition to mechanical stability, creep resistance is also associated with electrical stability of the electrically conductive adhesive bond when placed under mechanical stress. While some degree of enhanced creep resistance might be expected when an organophilic clay is added to an adhesive composition, the observed improvements far exceeded any reasonable expectations. The ability of the adhesive systems of the present invention to achieve both fast bonding and to rapidly develop such high creep resistance is a tremendous advantage. In applications in which high creep resistance is needed, this allows the thermoplastic compositions of the present invention, and the accompanying fast bonding characteristics, to be used in the place of thermosetting adhesives that might not achieve bonding as fast.

Over certain ranges of concentration of the organophilic clay in the adhesive composition, it is also observed that the addition of the organophilic clay provides adhesive systems with dramatically improved peel strength as compared to the same composition without the clay. This significant benefit is surprising, because such improvements are demonstrated when the loading of the organophilic clay is low. Such improvements are also surprising because the addition of hard particulate fillers can be associated with an increase in modulus along with a decrease in toughness and elongation to break.

Because recrystallization (i.e. crystallization after a heating step sufficient to melt some or all of the crystalline region in the adhesive composition) occurs rapidly, the adhesive compositions of the present invention also can be further processed relatively soon after hot melt processing. Thus, for instance, laminates incorporating the adhesive compositions may be die cut soon after bonding because the modulus of the melt increases rapidly after lamination. Note that die cutting would have to be delayed for a longer period for otherwise identical systems that lack the clay. It is also observed that the surface tack of the adhesive is rapidly reduced after bonding as compared to a comparable adhesive system made without clay.

While not wishing to be bound by theory, it is believed that the synergistic interaction between the thermoplastic semi-crystalline polymer(s) and the organophilic clay results because the organophilic clay provides nucleation sites for faster recrystallization of the semi-crystalline polymer following hot melt processing. Recrystallization has been observed to occur much more rapidly as compared to otherwise identical comparative compositions lacking the organophilic clay. Surprisingly, the enhanced recrystallization rate has not been observed when other clay, e.g., hydrophilic clay, is substituted for the organophilic clay. Additionally, it is believed that the clay provides surface sites for adsorption of the polymer molecules of the adhesive, and due to its highly anisotropic dimensions, the clay serves more efficiently in this regard than conventional spherical fillers (e.g. silica).

As still yet another advantage, preferred embodiments of the present invention substantially avoid the formation of cavitation voids during the bonding process. While the reason that the present invention reduces cavitation voids is not known with certainty, a rationale can be suggested. Specifically, it is believed that the improvements with respect to internal strength in the melt, recrystallization rate, creep resistance, and peel strength can develop so rapidly after the bonding pressure and heat are removed, that with a low level of creep, the substrates return towards their original position more slowly. It also is possible that the substrates move slowly back towards their original position through a low level of creep of the adhesive. This slower process would allow for a gradual volume change of the adhesive, with substantially reduced formation of voids. The ability of a thermoplastic to achieve this kind of result is surprising, because hot melt adhesive thermoplastic polymers generally have not been characterized by a level of internal strength immediately upon removal of the bonding pressure and heat needed to avoid the formation of cavitation voids.

As still yet another advantage, in preferred embodiments of the present invention, the addition of the organophilic clay does not substantially compromise the transparency of the adhesive composition. It is beneficial to be able to see through adhesive films when aligning a second substrate to features on a first substrate, after the adhesive layer has been put into place. For example, it is beneficial to be able to observe the circuit traces on a printed circuit board through the adhesive when a flex circuit is being attached to the printed circuit board via the adhesive. In this way, the traces may be more easily aligned with each other. Inclusion of organophilic clays of the present invention preferably maintains the percent transmission of the composition, in the visible region of the spectrum, at least 80% of that of the same composition made without the organophilic clay, more preferably it maintains at least 85%, and most preferably at least 90%. In the practice of the present invention, any suitable procedure for determining percent transmission may be used inasmuch as the degree of transmission maintained is determined on a relative basis. Preferably, the general techniques described in ASTM E169-99, and applied to film form samples may be used.

The clay component of the present invention is derived from ingredients comprising at least one organophilic clay. Organophilic clays are known and a wide variety of such materials may be advantageously incorporated into adhesive compositions of the present invention. The term "organophilic clay," as used herein, preferably refers to a clay that has been surface-modified to convert at least a portion of its surface nature from an hydrophilic state to an organophilic state (preferably to a hydrophobic state). For example, in one embodiment, a clay may initially have both hydrophilic and organophilic sites. However, upon modification according to the present invention, at least a portion of the hydrophilic sites are converted to organophilic sites. In other embodiments, a clay initially contains essentially only hydrophilic sites and, upon modification according to the present invention, at least a portion of the hydrophilic sites are converted to organophilic sites. Preferably, at least about 50% of exchangeable cations on the unmodified hydrophilic clay are exchanged with organophilic modifying cations.

Organophilic clays may be prepared from hydrophilic clays using conventional processing methods. According to one illustrative approach, organophilic clay suitable for use in the practice of the present invention may be derived from one or more suitable hydrophilic clays, preferably any phyllosilicate or other clay that has an anisotropic, preferably sheet-like shape. Examples of such clays include, but are not limited to, hydrated aluminum silicate, kaolinite, atapulgite, illite, halloysite, beidelite, nontronite, hectorite, hectite, bentonite, saponite, and montmorillonite. The smectite clays such as, for example, beidelite, nontronite, hectorite, hectite, bentonite, saponite, and montmorillonite are preferred.

The preferred smectite clays which may be utilized as one of the starting materials of the present invention are those which have been conventionally utilized in the prior art. Suitable smectite-type clays are those which have a cation exchange capacity of at least 50 milliequivalents (meq.) weight (wt.) per 100 grams of clay (active basis). Useful smectite clays for such purposes include the naturally occurring Wyoming variety of swelling bentonite and similar clays. Another suitable example is hectorite, which is a swelling magnesium-lithium silicate clay. The smectite clay(s) are preferably converted to the sodium form if they are not already in this form. This can be effected, as is known in the art, by a cation exchange reaction. Alternatively, the clay can be converted to the sodium form via an aqueous reaction with a soluble sodium compound.

Smectite-type clays prepared synthetically can also be utilized, such as montmorillonite, bentonite, beidelite, hectorite, saponite, and stevensite. Such clays, and processes for their preparation, are described in WO 97/30950 and U.S. Pat. Nos. 4,695,402; 3,855,147; 3,852,405; 3,844,979; 3,844,978; 3,671,190; 3,666,407; 3,586,478; and 3,252,757, all of which are herein incorporated by reference in their respective entireties.

The quaternary ammonium compounds which can be utilized in the compositions of the present invention are known agents typically utilized in the preparation of organoclays and include alkyl ammonium compounds of the formula

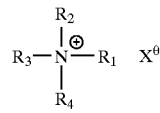

wherein $R_1$, $R_2$, $R_3$, and $R_4$ are independently selected from suitable monovalent moieties of which representative examples include moieties selected from the group consisting of linear or branched, saturated or unsaturated alkyl groups having 1 to 22 carbon atoms; aralkyl groups which may be benzyl and substituted benzyl moieties; substituted and/or non-substituted aryl groups; beta, gamma-unsaturated groups having six or less carbon atoms; hydroxyalkylgroups having two to six carbon atoms; hydrogen; and combinations thereof; with the proviso that at least one of the substituents is a linear or branched, saturated or unsaturated alkyl group; and X is the salt anion. Optionally, two or more of the $R_1$, $R_2$, $R_3$, and $R_4$ may be co-members of a divalent moiety linked to the N atom to form a cyclic structure or the like.

Exchange of the hydrophilic clay ions with organophilic modifying cations causes the modified clay to precipitate from the water solution. The resultant precipitated, organophilic clay is then dried to remove excess water. Many naturally occurring clays are in the form of a stack of platelet-shaped particles having a separation between plates on the order of a few angstroms. As a consequence of being rendered organophilic, it is believed that the platelet separation increases, e.g., up to perhaps ten to about 20 angstroms. When mixed with polymer, which is compatible with the organophilic clay surface, it is believed that the polymer can cause further plate separation, to such an extent that the clay platelets exfoliate or perhaps exist as tactoids swollen with polymer. This enhances the homogeneity and dispersion of platelets within the polymer. It is believed that such polymer-facilitated separation is one factor that helps enable the platelets to function as melt-strength enhancers and as recrystallization nucleus sites. This leads to faster recrystallization after a mixture containing semi-crystalline polymer and the organophilic clay is hot melt processed. This also leads to higher melt strength, which can be valuable in reducing the formation of cavitation voids. It is preferred that the clay is at least partially exfoliated.

Suitable organophilic clays are commercially available. For example, organophilically-modified montmorillonites are available under the trade designations SCP CLOISITE 20A, SCP CLOISITE 15A, SCP CLOISITE 10A, SCP CLOISITE 6A, SCP CLOISITE 30B, CLOISITE 25A, CLOISITE 93A, and SCPX CLOISITE 2398 from Southern Clay Products, Gonzalez, Tex. Others are available under the trade designation, NANOMER, from Nanocor Inc.; Arlington Heights, Ill.

The individual platelets of an organophilic clay are typically nanometer sized, tending to have a length from one end to the other in the range of 50 to 1000 nanometers, however the thickness of each individual platelet is typically 1 to 2 nanometers. Thus, such particles are generally substantially smaller than the electrically conductive particles. For instance, the ratio in the average size of the electrically conductive particles to the average size of the long dimension of the organophilic clay platelets is typically in the range from about 2:1 to about 1600:1, preferably 10:1 to about 1600:1.

The adhesive composition of the invention typically may comprise a wide range of amounts of the organophilic clay with beneficial results. Depending upon the desired use, a sufficient amount of the clay is added to help enhance creep resistance, enhance recrystallization rate, reduce cavitation voids, increase peel strength, combinations of these, and the like. As general guidelines, the adhesive compositions preferably include from about 0.1 to about 40, preferably 1 to 25, more preferably 1 to about 12 weight percent of the organophilic clay based upon the total weight of the composition.

Optionally, one or more adjuvants may be incorporated into the adhesive compositions of the present invention in accordance with conventional practices. Representative examples of adjuvants include, for example, tackifiers, plasticizers, curing agents, antioxidants, surfactants, fungicides, bactericides, antistatic agents, dyes, organic or inorganic fillers, coupling agents, thermally conductive materials, scrims, combinations of these, and the like. Desirably, any such adjuvants are used in amounts that do not materially adversely affect the desired performance properties of the hot melt adhesive composition, nor, more specifically, the desired performance of the conductive adhesive.

The semi-crystalline polymer-based hot-melt adhesives of the invention may be prepared by conventional methods, except accompanied by the addition of the organophilic clay. The adhesive compositions of the invention are typically prepared by melt mixing the components in a molten or softened state using devices that provide dispersive mixing, distributive mixing, or a combination thereof. Both batch and continuous methods of mixing may be used. Examples of batch methods include internal mixing and roll milling. Examples of continuous methods include single screw extruding, twin screw extruding, disk extruding, reciprocating single screw extruding, and pin barrel single screw extruding. Continuous methods can utilize distributive elements, pin mixing elements, static mixing elements, and dispersive elements such as MADDOCK mixing elements and SAXTON mixing elements.

The order in which the ingredients of the adhesive compositions are combined may impact the degree to which the organophilic clay undergoes exfoliation. Because exfoliation of the clay correlates to the desired improvements in creep resistance, peel strength, recrystallization rate, and other benefits, it is generally preferred to combine ingredients in a manner that facilitates exfoliation. It is also preferred that the exfoliation process is a solventless process, i.e., no solvent is used in the process that requires later removal.

For example, in one preferred approach suitable for compounding ingredients comprising a thermoplastic semi-crystalline adhesive polymer, organophilic clay, a tackifier, optionally electrically conductive particles, and one or more other optional ingredients, the clay is first combined with the individual adhesive component with which it is most compatible and in which it will exfoliate the most completely. In some cases this will be the tackifier component. In others, it may be the semi-crystalline thermoplastic polymer. In one preferred embodiment of the invention, the polymer is first melted and then combined with the clay in the absence of at least a portion and more preferably all of one or more of the other ingredients. The compounding temperature should be selected such that it is above the softening point of the exfoliating agent but below the decomposition temperature of the components, including the decomposition temperature of the organic components of the clay. In the case of such preferred embodiments of the invention, when the polymer melt and the organophilic clay are compounded, the clay will undergo the desired exfoliation. Excluding the tackifier at this stage of compounding is most preferred as the presence of the tackifier has been observed to inhibit exfoliation of the clay.

After the adhesive is compounded, the clay is desirably and preferably in an exfoliated condition and the clay platelets are believed to exist in the mixture as singlets, doublets, triplets, and/or small tactoids swollen with a portion of some or all components of the adhesive composition. It will be readily understood by one skilled in the art that complete exfoliation into singlets is not necessary to show the desired property improvements whereas conversely the presence of an excess of tactoids might adversely affect the properties of the adhesive composition. Other optional ingredients, if any, and optionally the electrically conductive particles now may be incorporated into the melt mixture. Note, however, that the electrically conductive particles optionally may be incorporated into or onto the composition later, if desired, after the composition has been applied to a substrate or formed into a film.

The equipment used to melt process the ingredients should provide enough shear and heat to result in exfoliation of the clay, but not so much shear or heat that the clay is caused to aggregate or agglomerate into clumps, as might be expected if the organic component on the clay is degraded. In preparation of the preferred compositions of the invention, the use of a twin screw extruder with three separate feed zones and three processing sections is preferred. The adhesive polymer is added to the feed zone and subsequently melted. The organophilic clay is drop fed into zone 4 and mixed prior to the addition of other ingredients, such as tackifier, in the zone 5 of the extruder. A specific example of one twin screw extruder found to be suitable in the practice of the present invention is available under the trade designation Lab Extruder LSM 30.34 from American Leistritz Extruder Corporation, Somerville, N.J., with a length/diameter ratio of 40.

The following screw design was employed, as listed from the feed section downstream.

Screw Design, beginning at drive end of extruder:
ZD-7.5
ZD-7.5
GFA-2-60-120
GFA-2-45-60
GFA-2-45-60
KB4-2-60-30-RE
KB3-2-45-30-RE
KB3-2-45-60-RE
KB4-2-60-90
GFA-2-60-120
GFA-2-60-30
GFA-2-45-60
GFA-2-45-30
KB4-2-60-30-RE
KB4-2-60-30-RE
KB4-2-60-30-RE
KB2-2-30-30-RE
KB3-2-45-90
GFA-2-60-60
GFA-2-60-60
GFA-2-45-60
GFA-2-45-60
GFA-2-30-30
KB4-2-60-60-RE
KB3-2-45-90
GFA-2-20-30

The following standard American Leistritz element designation should be taken into consideration for the above design:

| Designation | Element Type |
| --- | --- |
| ZD-7.5 | Spacer, 7.5 mm |
| GFA-2-P-L | Bilobal forward conveying<br>P = Pitch<br>L = Element length |
| KBN-2-L-Theta-RE | Bilobal kneading block, forward conveying<br>N = Number of kneading disks<br>L = Element length<br>Theta = Twisting angle (degrees)<br>RE = Forward conveying (blank if neutral) |

In preferred embodiments, the adhesive composition of the present invention is preferably provided in the form of an adhesive film. For some end-use applications, the adhesive film of the present invention is preferably nontacky or only slightly tacky at the intended handling temperature, which is understood to be a temperature lower than that at which the adhesive bond will be made. An adhesive film of the present invention is typically coated onto a suitable release liner, and is storage stable between release liners or when stored in other suitable packaging for extended periods, e.g., 6 to 24 months or more. The molten adhesive composition may be formed into a film by continuous or batch hot melt forming methods. Continuous forming methods include, for example, drawing the molten adhesive composition out of a film die and subsequently contacting the composition to a moving plastic web or other suitable substrate. The extrudate can also be directed through a suitable press and/or other supplementary film forming tooling, such as rollers, knife coaters, and/or the like. After forming the film, the film can be solidified by quenching using direct methods, such as chill rolls or water baths, and indirect methods, such as impingement of a gas such as air.

The optional electrically conductive fillers or articles may be incorporated into the composition at one or more points in the process. For instance, when electrically conductive particles are used, the electrically conductive particles can be compounded into the composition in the extruder along with the other components, preferably downstream from the point at which the clay is added. Alternatively, after the film is made, but while it is in a suitably receptive state, such as may be achieved by heating to a temperature near but below the Tc, the electrically conductive fillers or articles can be placed into and/or onto the surface of the film and then embedded into the film with light pressure. A release liner desirably is positioned over the film before such pressure is applied or alternatively, the embedding pressure is applied by a roller or nip rollers with release surface(s). In a further alternative embodiment, electrically conductive particles may be placed into indentations in a microreplicated release liner, and then transferred to the surface of the adhesive film via a lamination process.

Hot melt adhesives comprising semi-crystalline polymers and organophilic clay have many advantages over ordinary hot melt adhesives. Firstly, the use of such clays dramatically increases the rate of recrystallization (i.e. after bonding) of thermoplastic, semi-crystalline polymers, leading to substantially more rapid build up of peel strength and creep resistance. Systems incorporating such clays and thermoplastic, semi-crystalline polymers tend not only to recrystallize faster but also tend to develop dramatically higher levels of creep resistance and peel strength as compared to otherwise identical systems lacking such clay. The improved creep resistance can result in improved durability (i.e., can support higher weight loading), and expanded temperature range use (e.g., up to the Tm of the semi-crystalline polymer on the high end of the temperature range use). Expanded temperature range use would be beneficial to bonded articles that must withstand hotter environments like car interiors or inside of shipping containers. The increased rate of recrystallization can result in improved bonding cycle times due to faster adhesive set times which would be useful in package sealing and product assembly.

In preferred embodiments, the adhesive compositions may be formulated as electrically conductive compositions, which may be in film form. The electrically conductive compositions of the present invention are useful in a wide variety of applications, particularly for electrically coupling electronic components together. In the specific case in which the size and distribution of the electrically conductive particles is such that the bonded adhesive demonstrates anisotropic electrical conductivity, the film is useful in making electrical connections in multi-layer constructions where lateral electrical isolation of the adjacent parts is required while the layers are to be electrically connected in the z-direction (perpendicular to the plane of the film).

When the adhesive composition contains electrically conductive particles such that it may be used as a ZAF, depending on the adhesive type and the size range of the particles, the bonding time, temperature, and pressure vary. Generally, the adhesive films of the invention are bonded at a temperature range of from 90° C. to 200° C. and a bond time of from 1 second to 5 minutes. Preferably, the adhesive films are bonded at a temperature of between 110° C. and 160° C. and a bond time of from 3 seconds to up 90 seconds. More preferably, the adhesive films are bonded in from 3 to 20 seconds at a temperature of from 120° C. to 150° C. The amount of pressure required for bonding depends upon factors including the nature of the adhesive composition, the substrates to be bonded, and the nature of the device being formed. For some bonds, no applied pressure may be needed. For others, sufficient pressure is applied so to cause the adhesive to flow enough to allow the conductive material to interconnect the appropriate electrical contacts and thereby form an electrically conductive adhesive bond. In general, it is desirable that sufficient pressure is applied to the heat-bondable adhesive film to cause uniform wetting of the adhesive onto the substrate surface. The amount of pressure required (if any) may be determined by one skilled in the art without undue experimentation. As suggested guidelines, bonding pressures of 0.3 to 6.9 MPa, more preferably 0.69 to 2.0 MPa may be used.

The thickness of the adhesive film/composition that is best suited to perform in a particular application depends on the intended application and the adherends (electronic components and circuit substrates) that are to be bonded together. For example, for electronic applications, the adhesive layer should not be so thin that it becomes difficult to fill the volumetric space between the electronic component and the circuit substrate, nor should it be so thin that it is difficult to wet out the substrates to be bonded. Nor should the adhesive be so thick that excessive adhesive flow occurs during bonding. Such excessive flow could, for example, undesirably carry the electrically conductive particles to the edges of the bondline. Within these guidelines, the thickness of the anisotropically conductive adhesives is typically about 12 micrometers to about 125 micrometers for electronic applications. For general adhesive use, the thickness can be higher and could typically be from 12 micrometers to 1000 micrometers.

Thus, it can be appreciated that the adhesive compositions of the present invention may be used to mechanically bond a first substrate to a second substrate. In the more specific case in which the adhesive is electrically conductive, it may be used to couple one or more electrical components on a first structure to one or more electrical components on a second structure. In the even more specific case in which the adhesive is anisotropically electrically conductive, it may be used to make electrical connections between conductors on a first substrate and conductors on a second substrate, without providing direct interconnection of the conductors on either individual substrate.

The principles of the present invention also may be used to fabricate an electrically conductive tape in which an adhesive composition of the present invention is provided on a suitable backing. The backing of such embodiments includes a conductive material such as a metal foil, metal particles, and/or the like. The tape may be stored in a roll form, with or without the use of a release liner to protect the adhesive. In preferred embodiments, a surface of the backing functions as a release liner.

As specific illustrative examples, the compositions of the invention may be used to help establish electrical interconnection between electrically conductive pads on a chip or a chip module and electrically conductive traces on a substrate, wherein the substrate may be a flex circuit (including a Smart Card body), a printed circuit board, indium tin oxide (ITO)-coated glass, or glass with other electrically conductive traces; or electrical interconnection between electrically conductive traces on a flex circuit and electrically conductive traces on a second flex circuit, a printed circuit board, ITO-coated glass, and/or glass with other electrically conductive traces; or electrical interconnection between electrically conductive traces on two printed circuit boards or between a printed circuit board and a ground plane. These kinds of electrical interconnections find use in such applications as portable electronics, computers, laptop computers, key boards, touch screens, displays (both glass and plastic), cell phones, personal digital assistants (PDAs), pagers, Smart Cards, Radio Frequency Identification (RFID) Tags, Smart Labels, antennae for portable electronics, calculators, watches, radios, engine control units, and the like.

For purposes of illustration, a specific, representative electronic assembly according to the present invention is shown in FIG. 1. In the electronic assembly 10 a first substrate 12 having a first array of metallic bonding sites or circuit traces 14 on a surface thereof is adhesively attached to a second substrate 16 having a second array of bonding sites or circuit traces 18 on a surface thereof. An adhesive material 20, preferably a film, resides between the first substrate 12 and the second substrate 16 to provide an adhesive bond between them. Conductive particles 22 reside between and electrically interconnect the individual bonding sites 14 in the first array and the individual bonding sites 18 in the second array, and provide electrical connection between the first substrate 12 and the second substrate 16. The material 20 also includes organophilic clay 24.

Figure 2:
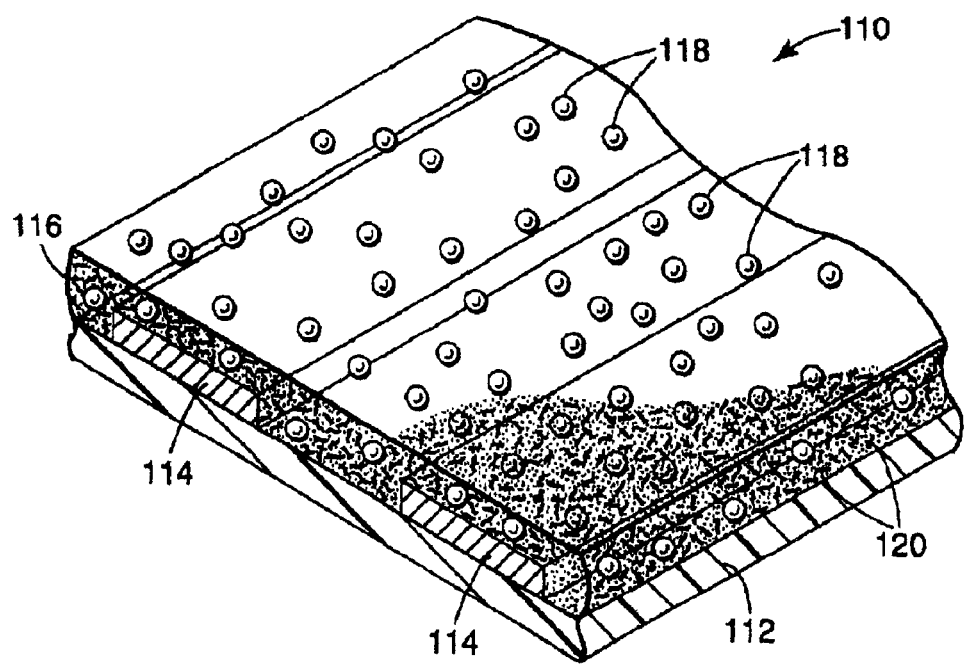
FIG. 2 is a plan view of an electronic assembly of the invention.

The electronic assembly of the present invention may also be provided in the form shown in FIG. 2. In FIG. 2 the electronic assembly 110 includes a substrate 112 having metallic circuit traces 114 on an upper surface thereof. An adhesive 116, preferably in the form of a film, is applied on the upper surface of the substrate and covers the circuit traces 114. When the assembly 110 is bonded to a second substrate (not shown), a population of conductive particles 118 in the adhesive film provides electrical interconnection between the circuit traces 114 and the corresponding bonding sites on the second substrate. Adhesive 116 also includes organophilic clay 120.

Figure 3:
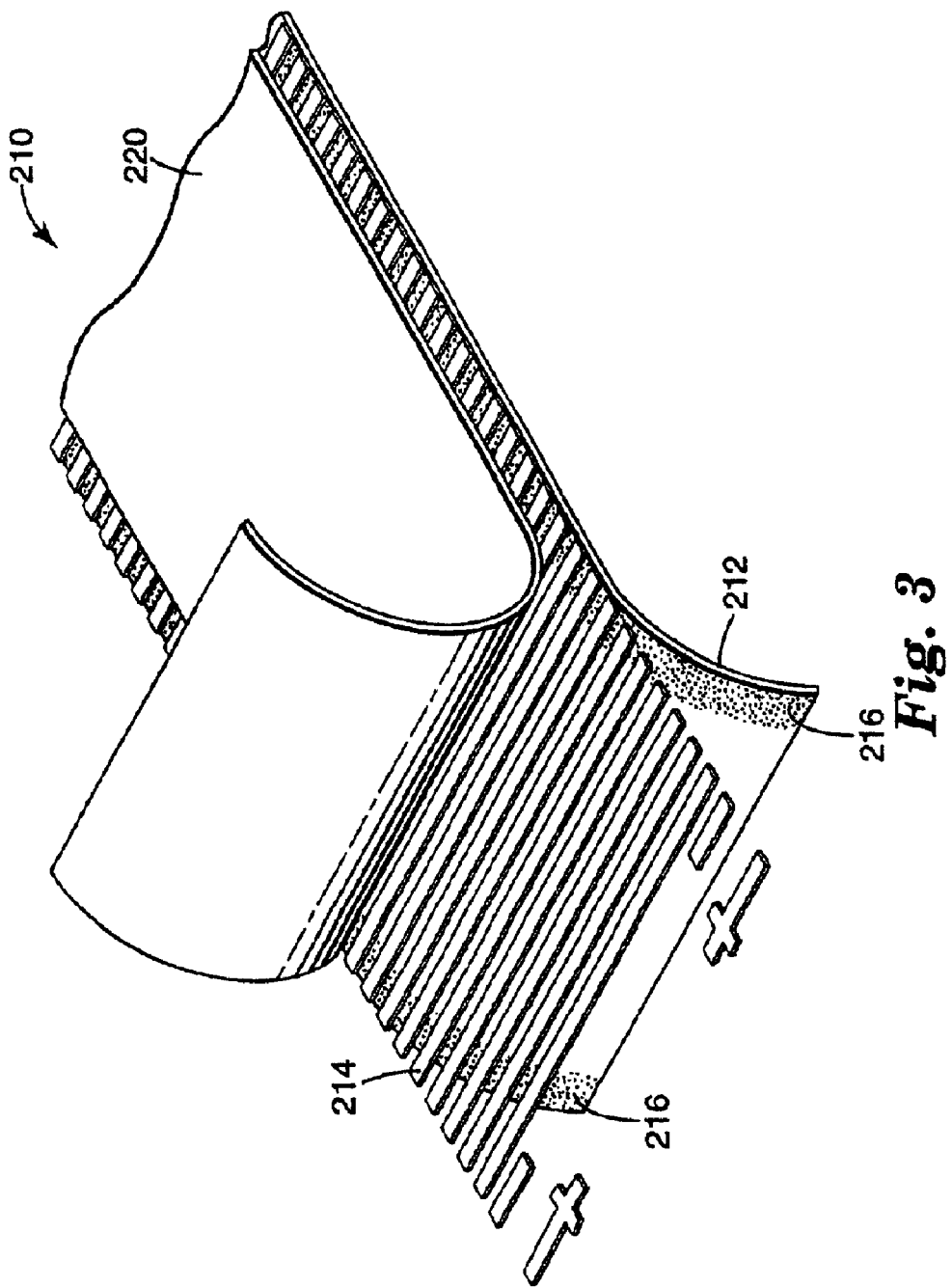
FIG. 3 is an exploded view of an electronic assembly of the invention.

Yet another embodiment of the electronic assembly of the present invention is shown in FIG. 3. The electronic assembly 210 in FIG. 3 is a flexible jumper which may be used to interconnect circuit boards, flat panel displays, or flexible circuits. The substrate 212 is a flexible polymeric material, preferably polyethylene terephthalate (PET), having a conductive metallic circuit 214 on a surface thereof. Opposed strips 216 of an adhesive film with conductive particles (not shown) and organophilic clay (not shown) provide electrical interconnection between, for example, the circuit board and the flat panel display (not shown), without the use of solder. The area of the circuit 212 not covered by the adhesive may be covered by an optional protective cover coat film 220.

Other objects, features, and advantages of this invention are further illustrated by the following examples, but the particular materials and amounts thereof recited in these examples, as well as other conditions and details, should not be construed to unduly limit this invention.

The following test methods were used in the examples:
Preparation of Conductive Adhesive Films:

Test methods including 90 Degree Peel to Printed Circuit Board, 90 Degree Peel to Plain FR4, Determination of Cavitation Voids, and In-situ Electrical Measurements During Application of Heat and Shear Force were performed using films loaded with electrically conductive particles. The particles used are nominal 43 micrometer diameter, silver-coated glass spheres which are available under the trade designation Conduct-O-Fil S-3000-S3P from Potters Industries Inc., Carlstadt, N.J. In order to add the particles to the adhesive base film, the particles were placed in a small glass jar, the opening of which was covered with a single taut layer of polyester fabric available under the trade designation Tetko PeCap-LE 305-40d from Advantage Supply, Roseville, Minn. The film, which was coated on a silicone-treated polyester release liner, was placed on a 90° C. hot plate for approximately 3 seconds in order to soften the film and make it receptive to the particles. The particles were sprinkled from the fabric-covered glass jar onto the surface from a distance of approximately 5 cm. Silicone-treated polyester release liner was then applied to the particle-coated surface of the film, which was placed on a 90° C. hot plate, and the laminate was rolled down by applying light hand pressure using an approximately 3 cm diameter rubber roller to provide a conductive adhesive film. The particle count on the surface of the film was 90+/−20 particles per square millimeter. For a 63 micrometer thick adhesive film, this corresponds to approximately 16 wt % particles. Variation of the particle content in the range from 5 wt % to 30 wt % is not expected to have a significant effect on measured values of peel strength.

90 Degree Peel to Printed Circuit Board:

Unless otherwise noted, the conductive adhesive test films, prepared according to Preparation of Conductive Adhesive Films, are loaded with silver-coated glass particles. A 46 mm wide×54 mm long×1.44 mm thick FR4-type printed circuit board with gold-coated copper metalized traces, approximately 30 micrometers thick and approximately 1.27 mm wide with approximately 1.18 mm spacing, (abbreviated hereinafter as "PCB"; from TRC Circuits Inc., Minneapolis, Minn.) and a 46 mm wide×39 mm long×0.127 thick mm polyester flexible printed circuit with silver ink traces, approximately 10 micrometers thick and approximately 1.27 mm wide with approximately 1.18 mm spacing (abbreviated hereinafter as "flex circuit"; from I Corp., Minneapolis, Minn.) were used as test substrates. Prior to applying the conductive adhesive film, both test substrates were cleaned using one wipe of isopropyl alcohol with a lint-free industrial KIMWIPES Delicate Task Wipers (available from Kimberly-Clark, Irving, Tex.) and allowed to dry.

A sample of conductive adhesive film was cut into 5 mm wide by approximately 55 mm long strips using a 5 mm-wide dual-blade razor cutter. Optionally, a silicone-coated polyester release liner was placed over the non-linered side of the adhesive prior to cutting (this liner was removed prior to the next step). The conductive adhesive film was placed with the linered side in contact with a 90° C. hot plate for about 3 seconds in order to soften, but not melt, the film and then removed from the hot plate. A flex circuit (with the silver-ink traces facing up) was placed on a hot plate and heated at 90° C. for about 2 seconds. The preheated, conductive adhesive film strip was applied to the flex circuit such that the adhesive made contact with the silver ink traces with the long direction of the adhesive film strip running perpendicularly to the silver ink traces, and with the adhesive film located about 1 mm away from the end of the traces. The linered side of the adhesive film was then pressed with light hand pressure and immediately subjected to two roll-down cycles using a hand rubber roller while the flex circuit was still on the hot plate. This provided uniform wet-out of the adhesive film strip and allowed for easy removal of the remaining release liner.

The laminated sample was then removed from the hot plate, the remaining release liner was carefully removed to expose the surface of the adhesive film strip without disturbing the adhesive film strip/flex circuit contact area, and the excess adhesive film strip was trimmed off of the edge of the flex circuit leaving an adhesive film area of 5 mm×46 mm that could be overlapped onto the PCB.

The second surface of the adhesive film strip/flex circuit laminate was then pre-tacked to the PCB by placing the non-silver ink side of the flex circuit in contact with a 90° C. hot plate for about 2 seconds in order to soften but not melt the film, removing from the hot plate, and pressing the assembly onto a PCB having been pre-heated on a 90° C. hot plate for about 2 seconds, with gold-coated copper traces facing up, aligning the overlapped pairs of circuit traces and connecting the flex circuit to the PCB. The pre-tacked assembly being heated on hot plate was subjected to two roll-down cycles while on the hot plate using the hand rubber roller described above to obtain uniform wet out of the film to the substrates.

Each assembly was then bonded individually using a DCI constant heat bonder Model No. 1093 (available from DCI Inc., Lenexa, Kans.). The DCI bonder thermode was set to 285° C. unless otherwise stated in the Examples. Thermally conductive silicone rubber SARCON 20GTR (200 micrometer-thick, from Fujipoly America, Kenilworth, N.J.) was used as a compliant layer between the thermode and the top of the assembly.

The 3 mm wide by 76 mm long metal thermode, held at constant temperature, was pressed onto the assembly with a pressure of approximately 1.45 MPa (210 psi). The bond time was set for 5 seconds, unless otherwise noted. The thermode temperature was set to 285° C., unless otherwise noted.

90 Degree Peel testing was done in a room held at 23±3° C. and 50% relative humidity using an INSTRON Model 4465 mechanical testing machine (available from Instron Corporation, Canton, Mass.) equipped with a 9 kg (20 lb) load cell and a 90 degree peel test jig. The jaw separation rate was 12.7 mm/minute. The maximum load was recorded, and divided by the bond width in order to calculate peel strength in N/mm. A single assembly was tested for each test film.

90 Degree Peel to Plain FR4:

Bonded assemblies were prepared as described in the Test Method 90 Degree Peel to Printed Circuit Board, except that plain FR4 (i.e. with no conductive traces) (1 mm thick, available from Electroply, El Segundo, Calif.) was used in place of the PCB, and 500 gauge MELINEX 453 treated polyester film (i.e. with no conductive traces) (available from ICI Polyester, Wilmington, Del.) was used in place of the polyester flex circuit.

Unless otherwise noted, the thermode temperature on the DCI Constant Heat Bonder was set to 260° C., the thermode pressure was 1.45 MPa (210 psi), and a bonding time of 10 seconds was used. The bonded assemblies were then aged for various times at ambient conditions (approximately 23° C. and approximately 50% relative humidity) as specified in the Examples.

For each conductive adhesive test film, three assemblies were tested according to the test method 90 Degree Peel to Printed Circuit Board, and an average value was reported. Typical deviation was +/−0.3 N/mm.

Determination of Cavitation Voids:

Bonded assemblies were prepared as described in the Test Method 90 Degree Peel to Printed Circuit Board using a thermode set point of 285° C. or as specified in the Examples, a bond pressure of 1.45 MPa (210 psi), and a dwell time of 5 seconds or as specified in the Examples.

The area between the conductive traces was examined in transmission using an OLYMPUS SZX9 zoom microscope (available from C.Squared Corporation, Tamarac, Fla.). Micrograph images were captured with the zoom lens set at 20× and with an 0.5× lens installed between the microscope and a video camera, using IMAGE-PRO PLUS Image Analysis Software (available from Media Cybernetics, Baltimore, Md.).

Conductive particles appeared as opaque regular circle shapes. Voids appeared as transparent non-circular shapes. Voids were classified according to the following scheme:

| | |
|---|---|
| None | No voids visible in micrograph |
| Small | Voids are infrequent and discrete, and are typically less than 130 micrometers across their major axis |
| Large | Voids are approximately 200 micrometers or larger across their major axis, and many are in contact with other voids |

Determination of Storage Shear Modulus (G') at 150° C.:

Storage shear modulus (G') was determined by Parallel Plate Dynamic Mechanical Testing. Sample films approximately 1 mm thick, without conductive particles, were prepared by laminating together adhesive base films of approximately 60 micrometers thick using a temperature of approximately 85° C. and light hand pressure. The sample films were tested in a parallel plate geometry, using 8 mm diameter plates, on an ARES Rheometer (available from Rheometric Scientific, Piscataway, N.J.). The test frequency was 1 Hertz and the temperature heating rate was 5° C./min. The sample film was placed in the rheometer at room temperature (25° C.), and tested from 25° C. to 200° C. at 1% strain. The storage shear modulus (G') as measured at 150° C. was reported.

Determination of Storage Shear Modulus as a Function of Time:

Sample films approximately 1 mm thick were prepared as described in Determination of Storage Shear Modulus at 150° C. The sample films were tested in a parallel plate geometry, using 25 mm diameter plates, on an ARES Rheometer (available from Rheometric Scientific, Piscataway, N.J.). The sample film was loaded into the instrument at room temperature, heated to 170° C. and held at that temperature for 10 minutes using a constant gap setting. The instrument's oven was then opened so that excess film could be scraped away from the edge of the plates. The sample was then cooled to 70° C. and held at that temperature for the duration of the test. This temperature was selected to be low enough to allow recrystallization to occur, e.g., below the crystalline melt temperature. For the remainder of the test, the material was held under a compressive force of approximately 30 to 100 grams. Gaps between the plates (after removing excess material that flowed out during the 170° C. step) were 0.6 to 0.8 mm. Frequency sweeps were made from 15 Hz to 0.1 Hz, with a strain of approximately 5%, and the value of the storage shear modulus at 1.2 Hz was recorded as a function of the length of time that the material had been at 70° C.

In-Situ Electrical Measurements During Application of Shear Force:

Sample assemblies consisted of a flexible printed circuit (flex) bonded to a printed circuit board (PCB) with the electrically conductive adhesive film being tested. Bonds were made with the bonding equipment and settings as described in the Test Method 90 Degree Peel to Printed Circuit Board.

The flex used was of a copper/Kapton™ polyimide film type, fabricated by PDI, Inc, Plymouth, Minn., using DuPont Pyralux™ Wash. as the laminating adhesive between the copper and Kapton™. The printed circuit board was based on copper/FR4 board also fabricated by PDI. A hard gold (over nickel) finish was used on all copper surfaces (flex and board). The circuit board was of dimensions 66 mm×102 mm with 17 evenly spaced circuit lines of width 1.27 mm running down its length. The flex circuit was 6 mm by 50 mm with a single 1.27 mm wide circuit line running centered down its length. Silver-ink/polyester flexible circuit jumpers with equivalent line count and spacing (available from I-Corp, Minneapolis, Minn.) were bonded to the ends of the PCB using 3M™ Z-axis Adhesive Film 7303 (available from 3M Company, Saint Paul, Minn.). This enabled the PCB to be connected to cabling via an insertion connector used in conjunction with the flex circuit jumpers.

Bonds were made with the flex circuit laying at right angles to the circuit lines on the board, forming a 'cross' or 'plus' shaped configuration, with 1.27 mm×1.27 mm overlap areas between the circuit lines on the flex and the PCB. With the cross configuration, four-wire resistance measurements of the adhesive in the overlap areas were taken as follows. A current path was formed between an individual line on the board and one end of the flex circuit. A voltage difference was measured between the circuit line on the board and the circuit line on the flex with connection points at the ends opposite to the current connections. Unused circuit lines at the sides of the board facilitated probing the flex; these lines connected electrically to flex by way of the conductive adhesive being tested. In such a four-wire configuration, no significant current flows between the voltage connections, hence the measured voltage drop is equal to the voltage drop at the point where current passes through the adhesive, and the ratio of the voltage drop to the supplied current gives the resistance through the adhesive, as desired. A 7000 series Scanner (Keithley Instruments, Cleveland, Ohio) was used to toggle connection points along middle 12 circuit lines of the circuit board, giving 12 accurate adhesive-resistance measurements per sample assembly.

For automated electrical measurement, the circuit board was interconnected to cables as described earlier. The cables lead to hard-wired connections in the Scanner to which was connected a Keithley Instruments 236 Source Measure Unit (SMU). A Hewlett Packard VECTRA Pentium III computer running LabView 5.0 (available from National Instruments, Austin, Tex.), was used to control the Scanner and SMU. The Scanner was configured to run in 4-pole mode, switching the source current and sense voltage connections of the SMU to connection points on the test board, as described earlier. The SMU was programmed to source 100 milliamp (mA) source current, and to measure the voltage drop across the adhesive as previously described. The compliance voltage was set to 200 millivolts (mV).

The Scanner was additionally wired to accept the voltage output of a thermocouple module (model 80TK, available from Fluke Corporation, Everett, Wash.), into which was plugged a thermocouple (5SC-TT-K-36-36, available from Omega Engineering, Inc., Stamford, Conn.). In this manner, the temperature of the bond line was measured along with the resistance readings. A trough was milled in the board in the region between two circuit lines to accommodate the thermocouple.

In order to measure the electrical effects of applying a shear force to a temperature controlled sample, the bonded sample was attached with 3M™ Thermally Conductive Adhesive Transfer Tape #9890 to an aluminum block (containing a cartridge heater and controlled by a temperature controller). The block was clamped to a support such that the flex hung with its long axis vertical. Electrical connections were made as described earlier. A forceps was clipped to the flex circuit, and a spring, with a spring constant of 70 N/m, was attached to the forceps.

Electrical measurements were then taken under the following conditions:

Condition 1. With no load.

Condition 2. With a 250 g weight hanging in a "static" mode (i.e. not under oscillation).

Condition 3. With a 250 g weight oscillating on a spring.

Condition 4. With the 250 g weight hanging in "static" mode, and while the temperature of the sample was raised to 70° C.

Condition 5. With the 250 g weight oscillating at 70° C.

The median resistance of twelve interconnects for each condition tested was reported.

Determination of Melt Endotherm via Differential Scanning Calorimetry:

Approximately 10 milligrams of film, without conductive particles, was placed into an aluminum Autosampler Pan (available as Part Number 990999.901 from TA Instruments, New Castle, Del.) which was then crimped. The sample in the pan was placed in a 170° C. oven. After at least 15 minutes, the sample was removed from the oven and placed at ambient temperature (approximately 24° C.). The melt endotherm was measured within 5 hours of placing the sample at ambient temperature. The melt endotherm, in Joules/gram, was determined using a Differential Scanning Calorimeter Model 2920 (available from TA Instruments, New Castle, Del.), using a 5° C./min ramp from 25° C. to 170° C., and integrating the area under the endotherm peak found within the temperature range of 65° C. to 140° C.

Determination of Percent Transmission of Films:

Percent transmission of adhesive base films (without conductive particles) were measured using an HP 8425A UV-Visible Spectroscopy System, available from Agilent Technologies, online at www.chem.agilent.com. The general techniques described in ASTM E169-99 were followed. After taking a background spectrum, spectra were measured over a wavelength range of 200 to 800 nanometers (mn) for each of the films tested. The absorbance at a wavelength of 540 nm was recorded, and normalized to correspond to that of a 65 micrometers thick film. This normalized absorbance value was then converted to % Transmission and reported.

In the following examples, all amounts, percents, and parts are by weight unless otherwise specified.

COMPARATIVE EXAMPLE 1 (NO CLAY)

50 parts by weight of PEBAX 3533 polymer (available from Elf Atochem, Glen Rock, N.J.) was compounded with 50 parts by weight of SYLVARES 2040 tackifier (available from Arizona Chemical, Panama City, Fla.) in a Lab Extruder LSM 30.34 twin screw extruder (available from American Leistritz Extruder Corporation, Somerville, N.J.) and with the screw configuration previously described.

The extruder had a Feed Zone with a cooled throat followed by ten heated zones. Zones 1–4 were set at 229° C., Zones 5–6 were set at 221° C., Zones 7–8 were s at 213° C., and Zones 9–10 were set at 210° C. The screw speed was set at 125 rpm. PEBAX 3533 polymer was added in through an open port in the Feed Zone, and SYLVARES 2040 tackifier was added through an open port in Zone 4. Total throughput was 13.6 kilograms/hour (30 pounds/hour).

The compounded material was fed to a drop die and coated onto a 57.5 micrometer thick polyester release liner (available from Loparex, Willowbrook, Ill.) at a thickness of 62.5 micrometers, and a coated width of approximately 30.5 cm to provide a base film. The die temperature was 138° C., and the chill roll (located under the liner onto which the material was cast) was set at 3° C.

The conductive adhesive film of Comp. Ex. 1 was evaluated according to the test methods outlined hereinabove for 90 Degree Peel to Printed Circuit Board, 90 Degree Peel to Plain FR4, and Cavitation Voids. The base film of Comp. Ex. 1 was evaluated according to the test method Storage Shear Modulus at 150° C. Results are reported in Table 2.

EXAMPLE 1

SCP CLOISITE 20A organophilically-modified montmorillonite, available from Southern Clay Products, Gonzalez, Tex., was added to a 50:50 mixture by weight of PEBAX 3533 polymer and SYLVARES 2040 tackifier such that the overall composition was 3 wt. % SCP CLOISITE 20A clay based on the total weight of the PEBAX polymer, plus SYLVARES 2040 tackifier plus SCP CLOISITE 20A clay.

The extruder of Comparative Example 1 was used to compound the material. Zones 1–8 were set to 229° C., Zone 9 was set to 221° C., and Zone 10 was set to 210° C. PEBAX 3533 polymer was added through an open port in the Feed Zone, SYLVARES 2040 tackifier was added through an injection port in Zone 2, and SCP CLOISITE 20A clay was added through an open port in Zone 4. Total throughput was 9.4 kg/hr (20.7 lbs/hr).

The compounded material was fed to the drop die of Comp. Ex. 1 and coated as described in Comparative Example 1 to provide the base film of Ex. 1.

The conductive adhesive film of Example 1 was evaluated according to the test methods outlined hereinabove for 90 Degree Peel to Printed Circuit Board, 90 Degree Peel Strength/Force to Plain FR4, and Cavitation Voids. The base film of Ex. 1 was evaluated according to the test method Storage Shear Modulus at 150° C. Test results are reported in Table 2 below.

EXAMPLE 2

The film of Ex. 2 was prepared using the components and procedure of Ex. 1, except that the amount of SCP CLOISITE 20A clay was 11.1 wt % and the throughput was 10 kg/hr (22.25 lbs/hr). The conductive adhesive film of Ex. 2 was evaluated according to the test methods outlined hereinabove for 90 Degree Peel to Printed Circuit Board, 90 Degree Peel to Plain FR4, and Cavitation Voids. The base film of Ex. 2 was evaluated for Storage Shear Modulus at 150° C. Test results are reported in Table 2 below.

EXAMPLES 3–4

SCP CLOISITE 30B clay (organophilically-modified montmorillonite, available from Southern Clay Products, Gonzalez, Tex.) was added to PEBAX 3533 polymer in the BRABENDER mixer and mixed for 10 minutes at a temperature of approximately 165° C. and a speed of 80 rpm.

A portion of the mixture was then removed, and SYLVARES 2040 tackifier was added and blended for 15–20 minutes at a temperature of approximately 150° C. and a speed of 80 rpm. The amounts of the components are given in Table 1.

The compounded material was pressed in a PHI Hydraulic Press Model TS21-H-C-8 (available from PHI, Pasadena, Calif.), set to a temperature of 140° C., and with a pressure gauge setting of 8896 newtons (2000 lbf). The film (between two release liners) was then pulled through a hot-knife coater with a temperature setting of 90° C. to provide the base film with a resultant film thickness within the range of 62.5 to 75 micrometers.

TABLE 1

| Component | Ex. 3 (parts) | Ex. 4 (parts) |
| --- | --- | --- |
| SYLVARES 2040 tackifier | 11.15 | 10.8 |
| SCP CLOISITE 30B clay | 0.7 | 2.7 |
| PEBAX 3533 polymer | 11.15 | 10.8 |

The conductive adhesive films were evaluated according to the test methods outlined hereinabove for 90 Degree Peel to Printed Circuit Board, 90 Degree Peel to Plain FR4, and Cavitation Voids. The base films were evaluated for Storage Shear Modulus at 150° C. Test results are reported in Table 2 below.

TABLE 2

| Test Method | Comp Ex. 1 | Ex. 1 | Ex. 2 | Ex. 3 | Ex. 4 |
| --- | --- | --- | --- | --- | --- |
| Cavitation Voids | Large | Large | None | Small | None |
| 90 Degree Peel to PCB, N/mm | 1.32 | 1.71 | 1.17 | 1.86 | 1.86 |
| 9O Degree Peel to Plain FR4, aged 15 minutes, N/mm | 1.50 | 1.90 | NT(1) | NT | NT |
| 90 Degree Peel to Plain FR4, aged 24 hrs, N/mm | 1.80 | 1.90 | NT | 1.43 | 0.22 |
| 90 Degree Peel to Plain FR4, aged 1 wk, N/mm | 1.60 | 2.30 | NT | NT | NT |
| G' at 150° C. (Pa) | 900 | 2000 | 8000 | NT | NT |

(1)NT = Not tested

The data shows the effect of organophilic clay on peel strength build-up and modulus at 150° C. as measured by parallel plate dynamic mechanical testing.

EXAMPLE 5

Film Ex. 5 was prepared using the components and procedure of Ex. 1, except that that amount of SCP CLOISITE 20A clay was 10 wt %, SYLVARES 2040 tackifier was added through an open port in Zone 8, the screw speed was 300 rpm, and the zone temperature settings were: Zone 1–4=229° C., Zones 5–8=199° C., Zone 9=188° C., and Zone 10=177° C. Total throughput was 10 kg/hr (22.22 lbs/hr).

The conductive adhesive film was evaluated according to the test methods outlined hereinabove for 90 Degree Peel to Printed Circuit Board and Cavitation Voids. Test results are reported in Table 7 below.

COMPARATIVE EXAMPLES 2–3

SCP CLOISITE Na+ unpillared clay (smectite hydrophilic clay, available from Southern Clay Products, Gonzalez, Tex.) was added to PEBAX 3533 polymer in the BRABENDER mixer and mixed for 10 minutes at a temperature of approximately 150° C. and a speed of 80 rpm.

A portion of the mixture was then removed, and SYLVARES 2040 tackifier was added and blended for 20 minutes at a temperature of approximately 150° C. and a speed of 80 rpm.

Adhesive base films of Comp. Ex. 2 and Comp. Ex. 3 were made following the procedure of Examples 3 and 4. The amounts of the components are given in Table 3.

TABLE 3

| Component | Comp. Ex. 2 | Comp. Ex. 3 |
| --- | --- | --- |
| SYLVARES 2040 tackifier | 10.8 | 11.15 |
| SCP CLOISITE Na+ unpillared clay | 2.7 | 0.7 |
| PEBAX 3533 polymer | 10.8 | 11.15 |

COMPARATIVE EXAMPLES 4–5

KAOPAQUE 20 clay (kaolin/China clay, available from Dry Branch Kaolin Company, Dry Branch, Ga.) was dried for five hours in a 35° C. vacuum oven at 340 Pa, and was then added to PEBAX 3533 polymer in the BRABENDER mixer and mixed for 10 minutes at a temperature of approximately 150° C. and a speed of 80 rpm.

A portion of the mixture was then removed, and SYLVARES 2040 tackifier was added and blended for 20 minutes at a temperature of approximately 150° C. and a speed of 80 rpm.

Adhesive base films of Comp. Ex. 4 and Comp. Ex. 5 were made following the procedure of Examples 3 and 4. The amounts of the components are given in Table 4.

TABLE 4

| Component | Comp. Ex. 4 | Comp. Ex. 5 |
| --- | --- | --- |
| SYLVARES 2040 tackifier | 10.8 | 11.15 |
| KAOPAQUE 20 clay | 2.7 | 0.7 |
| PEBAX 3533 polymer | 10.8 | 11.15 |

COMPARATIVE EXAMPLES 6–7

DIXIE CLAY clay (kaolin clay, available from R. T. Vanderbilt Co. Inc., Norwalk, Conn.) was dried for five hours in a 35° C. vacuum oven at 340 Pa, and was then added to PEBAX 3533 polymer in the BRABENDER mixer and mixed for 10 minutes at a temperature of approximately 150° C. and a speed of 80 rpm.

A portion of the mixture was then removed, and SYLVARES 2040 tackifier was added and blended for 20 minutes at a temperature of approximately 150° C. and a speed of 80 rpm.

Adhesive base films of Comp. Ex. 6 and Comp. Ex. 7 were made following the procedure of Examples 3 and 4. The amounts of the components are given in Table 5.

TABLE 5

| Component | Comp. Ex. 6 | Comp. Ex. 7 |
| --- | --- | --- |
| SYLVARES 2040 tackifier | 10.8 | 11.15 |
| DIXIE CLAY clay | 2.7 | 0.7 |
| PEBAX 3533 polymer | 10.8 | 11.15 |

COMPARATIVE EXAMPLES 8–9

KALLOID clay (kaolin clay, available from Unimin, New Canaan, Conn.) was dried for five hours in a 35° C. vacuum oven at 340 Pa, and was then added to PEBAX 3533 polymer in the BRABENDER mixer and mixed for 10 minutes at a temperature of approximately 150° C. and a speed of 80 rpm.

A portion of the mixture was then removed, and SYLVARES 2040 tackifier was added and blended for 20 minutes at a temperature of approximately 150° C. and a speed of 80 rpm.

Adhesive base films of Comp. Ex. 8 and Comp. Ex. 9 were made following the procedure of Examples 3 and 4. The amounts of the components are given in Table 6.

TABLE 6

| Component | Comp. Ex. 8 | Comp. Ex. 9 |
| --- | --- | --- |
| SYLVARES 2040 tackifier | 10.8 | 11.15 |
| KAOLLOID clay | 2.7 | 0.7 |
| PEBAX 3533 polymer | 10.8 | 11.15 |

Conductive adhesive films of Comparative Examples 1–9 were evaluated according to the test methods outlined hereinabove for 90 Degree Peel to Printed Circuit Board and Cavitation Voids. Test results are reported in Table 7 below.

TABLE 7

| Ex. No. | Bond Time at 285° C. Set Point (seconds) | Cavitation Voids | 90 Degree Peel to PCB (N/mm) |
| --- | --- | --- | --- |
| Comp. 1 | 1 | None | 0.50 |
| Comp. 1 | 2 | Large | 0.80 |
| Comp. 1 | 3 | Large | 1.15 |
| Comp. 1 | 5 | Large | 1.32 |
| Comp. 2 | 5 | Large | 1.50 |
| Comp. 3 | 5 | Large | 1.19 |
| 5 | 3 | None | 1.07 |
| 5 | 5 | None | 1.12 |
| Comp. 4 | 5 | Large | 2.13 |
| Comp. 5 | 5 | Large | 2.35 |
| Comp. 6 | 5 | Large | 1.88 |
| Comp. 7 | 5 | Large | 2.29 |

TABLE 7-continued

| Ex. No. | Bond Time at 285° C. Set Point (seconds) | Cavitation Voids | 90 Degree Peel to PCB (N/mm) |
|---|---|---|---|
| Comp. 8 | 5 | Large | 2.10 |
| Comp. 9 | 5 | Large | 1.68 |

The data show that the presence of the organophilic clay helps to reduce cavitation void formation while also increasing peel strength.

EXAMPLES 6–8

Three films were prepared as follows:

SYLVARES 2040 tackifier was placed in a BRABENDER (available from C. W. Brabender Instruments Inc., South Hackensack, N.J.) and mixed with SCP CLOISITE 20A clay for 10 minutes at a temperature of 130° C. using a screw speed of 70 rpm.

A portion of this mixture was then combined in the BRABENDER with PEBAX 3533 polymer and mixed for 10 minutes at a temperature of 150° C. using a screw speed of 80 rpm.

Adhesive base films of Ex. 6, Ex. 7, and Ex. 8 were prepared as described in Examples 3 and 4. The amounts of the components are given in Table 8.

TABLE 8

| Component | Ex. 6 | Ex. 7 | Ex. 8 |
|---|---|---|---|
| SYLVARES 2040 tackifier | 11.5 | 10.85 | 9.62 |
| SCP CLOISITE 20A clay | 1.3 | 2.71 | 5.18 |
| PEBAX 3533 polymer | 11.5 | 10.77 | 9.6 |

Conductive adhesive films of Ex. 6, Ex. 7, and Ex. 8 were evaluated according to the test methods outlined hereinabove for 90 Degree Peel to Printed Circuit Board and Cavitation Voids. Test results are reported in Table 10 below.

EXAMPLES 9–10

Examples 9–10 were prepared using the same components and procedure of Exs. 6–8, except that ODA/CWC organophilic clay (available from Nanocor Inc., Arlington Heights, Ill.) was used in place of SCP CLOISITE 20A clay.

The amounts of the components are given in Table 9.

TABLE 9

| Component | Ex. 9 | Ex. 10 |
|---|---|---|
| SYLVARES 2040 tackifier | 11.5 | 9.62 |
| ODA/CWC clay | 1.3 | 5.18 |
| PEBAX 3533 polymer | 11.5 | 9.6 |

Conductive adhesive films of Ex. 9 and Ex. 10 were evaluated according to the test methods outlined hereinabove for 90 Degree Peel to Printed Circuit Board and Cavitation Voids. Test results are reported in Table 10 below.

TABLE 10

| Ex. No. | Cavitation Voids (280° C. Set Point) | 90 Degree Peel to PCB, (N/mm) |
|---|---|---|
| 6 | Small | 1.27 |
| 7 | Almost None | 1.09 |
| 8 | Almost None | 0.93 |
| 9 | Small | 0.81 |
| 10 | Small | 0.42 |

The data shows how the presence of the organophilic clay affects cavitation void formation and peel strength.

EXAMPLE 11

The conductive adhesive films of Comp. Ex. 1 and Ex. 2 were made into test assemblies and tested according to the test method In-Situ Electrical Measurements During Application of Shear Force.

Results are shown as the Median Resistance of twelve interconnects (in milliOhms) as a function of the stress and temperature condition imposed.

| | Median Resistance, mOhms | | | | |
|---|---|---|---|---|---|
| Ex. No. | Condition 1 | Condition 2 | Condition 3 | Condition 4 | Condition 5 |
| Comp. 1 | 18.3 | 40.9 | 42.75 | 173.15 | 47.5 |
| 2 | 8.25 | 10.0 | 9.8 | 32.0 | 21.55 |

The data shows how the presence of the organophilic clay affects the response of the electrical resistance to changing levels of shear force acting on a bond.

EXAMPLE 12

The adhesive base films of Example 5 and Comparative Example 1 were tested for increase in storage modulus (G') as a function of aging time according to the test method Determination of Storage Shear Modulus as a Function of Time. The results are shown in the following table:

TABLE 11

| Time at 70° C. (min) for Comp. Ex. 1 | G' of Comp. Ex. 1 measured at 1.2 Hz (Pa) | Time at 70° C. (min) for Ex. 5 | G' of Ex. 5 measured at 1.2 Hz (Pa) |
|---|---|---|---|
| 0 | 9.24E+04 | 0 | 5.19E+05 |
| 4 | 9.38E+04 | 7 | 6.52E+05 |
| 40 | 1.11E+05 | 13 | 7.58E+05 |
| 154 | 3.51E+05 | 19 | 8.52E+05 |
| 233 | 5.07E+05 | 25 | 9.27E+05 |
| 801 | 8.63E+05 | 30 | 9.99E+05 |
| 1281 | 9.28E+05 | 44 | 1.16E+06 |
| | | 75 | 1.42E+06 |
| | | 1140 | 2.77E+06 |

EXAMPLE 13

The adhesive base films of Examples 3 and 5, and Comparative Examples 1, 5, 6, 7, and 8 were tested according to the test method Determination of Melt Endotherm via Differential Scanning Calorimetry. Results are shown in Table 12. For further comparison, a sample of Example 1 was stored at ambient conditions for 7 months. At the end of this time the sample was tested according to the method Determination of Melt Endotherm via Differential Scanning Calorimetry, except that the sample was placed directly into the Differential Scanning Calorimeter at 25° C., and was not subjected to the 170° C. oven step. The resultant melt endotherm measured was 2.7 Joules/gram (J/g).

TABLE 12

| Ex. No. | Melt Endotherm (J/g) |
|---|---|
| 3 | 4.8 |
| 5 | 4.4 |
| Comp. 1 | 0.8 |
| Comp. 5 | 0.27 |
| Comp. 6 | 0.26 |
| Comp. 7 | 0.35 |
| Comp. 8 | 0.39 |

EXAMPLE 14

Adhesive base films of Example 2, and Comparative Examples 1, 4, 6, and 8 were tested according to the method Determination of Percent Transmission of Films. The results are reported in Table 13.

TABLE 13

| Ex. No. | % Transmission at 540 nm normalized to 65 micrometer film thickness |
|---|---|
| Comp. 1 | 89 |
| 2 | 85 |
| Comp. 4 | 27 |
| Comp. 6 | 9 |
| Comp. 8 | 16 |

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. An electrically conductive adhesive composition comprising:
   a) a polymeric adhesive component comprising a semicrystalline thermoplastic polymer which comprises at least one polyether chain segment and at least one polyamide chain segment;
   b) an electrically conductive filler incorporated into the adhesive component; and
   c) a clay component incorporated into the adhesive component, said clay component comprising an organophilic clay.

2. The electrically conductive adhesive composition of claim 1, wherein the electrically conductive filler comprises a plurality of electrically conductive particles.

3. The electrically conductive adhesive composition of claim 1, wherein the electrically conductive filler comprises an electrically conductive scrim.

4. The electrically conductive adhesive composition of claim 1, wherein the composition comprises 1 to 80 volume percent of the filler based upon the total volume of the composition.

5. The electrically conductive adhesive composition of claim 1, wherein the adhesive component further comprises at least one curable material selected from a monomer, an oligomer, a polymer, and combinations thereof.

6. The electrically conductive adhesive composition of claim 1, wherein the thermoplastic polymer has a weight average molecular weight in the range of 1000 to 1,000,000.

7. The electrically conductive adhesive composition of claim 1, further comprising a tackifier.

8. The electrically conductive adhesive composition of claim 1, wherein the clay component comprises an organophilic smectite clay.

9. The electrically conductive adhesive composition of claim 1, wherein the composition comprises from about 1 to about 25 weight percent of the organophilic clay based upon the total weight of the composition.

10. An anisotropically, electrically conductive adhesive comprising:
    a) a polymeric adhesive component comprising a semicrystalline thermoplastic polymer which comprises at least one polyether chain segment and at least one polyamide chain segment;
    b) a plurality of electrically conductive particles incorporated into the adhesive component; and
    c) a clay component incorporated into the adhesive component, said clay component comprising an organophilic clay.

11. An electrically conductive adhesive composition comprising:
    a) a polymeric adhesive component;
    b) an electrically conductive filler incorporated into the adhesive component, wherein the electrically conductive filler comprises an electrically conductive scrim; and
    c) a clay component incorporated into the adhesive component, said clay component comprising an organophilic clay.

12. The electrically conductive adhesive composition of claim 11, wherein the adhesive component comprises a semi-crystalline, thermoplastic polymer.

13. The electrically conductive adhesive composition of claim 11, wherein the adhesive component further comprises at least one curable material selected from a monomer, an oligomer, a polymer, and combinations thereof.

14. The electrically conductive adhesive composition of claim 11, wherein the thermoplastic polymer has a weight average molecular weight in the range of 1000 to 1,000,000.

15. The electrically conductive adhesive composition of claim 11, wherein the thermoplastic polymer is hydrophobic.

16. The electrically conductive adhesive composition of claim 11, wherein the thermoplastic polymer is a block copolymer and comprises a hydrophobic block.

17. The electrically conductive adhesive composition of claim 11, wherein the thermoplastic polymer comprises at least one polyether chain segment and at least one polyamide chain segment.

18. The electrically conductive adhesive composition of claim 11, further comprising a tackifier.

19. The electrically conductive adhesive composition of claim 11, wherein the clay component comprises an organophilic smectite clay.

20. The electrically conductive adhesive composition of claim 11, wherein the composition comprises from about 1 to about 25 weight percent of the organophilic clay based upon the total weight of the composition.

* * * * *

UNITED STATES PATENT AND TRADEMARK OFFICE
CERTIFICATE OF CORRECTION

PATENT NO. : 6,884,833 B2
DATED : April 26, 2005
INVENTOR(S) : Chheang, Theary

It is certified that error appears in the above-identified patent and that said Letters Patent is hereby corrected as shown below:

Column 25,
Line 1, delete "(mn)" and insert -- (nm) --
Line 20, delete "s" and insert -- set --

Column 26,
Line 51, delete "9O" and insert -- 90 --

Column 32,
Line 17, after "adhesive" insert -- composition --
Line 61, delete "smectitc" and insert -- smectite --

Signed and Sealed this

Nineteenth Day of July, 2005

JON W. DUDAS
*Director of the United States Patent and Trademark Office*